United States Patent
Lewis

(10) Patent No.: US 6,635,500 B2
(45) Date of Patent: Oct. 21, 2003

(54) TREATMENT OF SUBSTRATES

(75) Inventor: David John Lewis, Swansea (GB)

(73) Assignee: Pure Wafer Limited, Swansea (GB)

( * ) Notice: Subject to any disclaimer, the term of this patent is extended or adjusted under 35 U.S.C. 154(b) by 0 days.

(21) Appl. No.: 10/037,237

(22) Filed: Nov. 9, 2001

(65) Prior Publication Data

US 2002/0058418 A1 May 16, 2002

(30) Foreign Application Priority Data

Nov. 11, 2000 (GB) .............................................. 0027626

(51) Int. Cl.⁷ ............................................... H01L 21/00
(52) U.S. Cl. ............................ 438/4; 438/689; 438/690
(58) Field of Search ................................. 438/689, 471, 438/4, 690, 691, 692, 693

(56) References Cited

U.S. PATENT DOCUMENTS

| | | | |
|---|---|---|---|
| 3,559,281 A | * 2/1971 | Mayberry et al. | 438/4 |
| 3,923,567 A | * 12/1975 | Lawrence | 438/4 |
| 5,233,216 A | * 8/1993 | Inoue et al. | 257/505 |
| 5,622,875 A | 4/1997 | Lawrence | |
| 5,660,642 A | * 8/1997 | Britten | 134/30 |
| 6,406,923 B1 | * 6/2002 | Inoue et al. | 438/4 |
| 2001/0039101 A1 | * 11/2001 | Wenski | 438/471 |
| 2002/0086539 A1 | * 7/2002 | Falster | 438/692 |

FOREIGN PATENT DOCUMENTS

| EP | 0774776 A2 | 5/1997 |
|---|---|---|
| EP | 0986097 A2 | 3/2000 |
| JP | 7122532 | 5/1995 |

* cited by examiner

*Primary Examiner*—Kevin M. Picardat
(74) *Attorney, Agent, or Firm*—Cook, Alex, McFarron, Manzo, Cummings & Mehler, Ltd.

(57) ABSTRACT

A process of reclaiming a semiconductor wafer 10 comprises the steps of a) removing films of foreign matter from the surface of the wafer 10 by etching, b) polishing opposite sides of the wafer 10 between contra-rotating polishing means 26, 28 to remove doped and diffused regions in the surface of the wafer substrate, c) rendering matt at least a portion of one only of the polished major surfaces of the wafer, d) cleaning the major surfaces of the wafer; and e) drying the wafer.

The wafer is not damaged because no abrasive grinding is used to remove the doped and diffused regions and the step of rendering matt enables the wafers to be subsequently processed using handling and processing apparatus which relies on a difference in finish to determine the correct side of the wafer to be processed.

6 Claims, 1 Drawing Sheet

TREATMENT OF SUBSTRATES

BACKGROUND OF THE INVENTION

1. Field of the Invention

This invention is concerned with improvements in or relating to the treatment of substrates and is especially concerned with the recovery or reclaim of semiconductor wafers.

2. Related Background Art

Semiconductor wafers typically are of silicon and the following description relates to such semiconductor wafers. The invention may also however be applied to semiconductor wafers of other materials if desired.

A typical used semiconductor wafer comprises a silicon substrate having two major surfaces disposed generally parallel to one another and edge surface portions extending between them, at least one of the major surfaces having components deposited or grown onto it, with or without layers of other conducting or insulating materials thereon.

The process of removing films of foreign material from a semiconductor grade silicon wafer and then polishing the wafer to a quality suitable for re-use as a test wafer used in semiconductor processes is called wafer reclaim. There are three distinct steps to this process, as follows:

(1) removal of deposited films of foreign material from the front and back surfaces as well as the edges of the wafer;

(2) removal of a layer from one surface of the wafer substrate, to remove any doped and diffused regions;

(3) polishing the surface of the wafer to the required surface properties and flatness; and (4) cleaning of the wafer to yield a silicon surface suitable for processing in a semiconductor production line.

U.S. Pat. No. 5,622,875 discloses a wafer reclaim process in which the film removal step is performed by grinding or chemical etching. Next, a layer of about 1 $\mu$m of the surface of the substrate is ground away to remove any doped and diffused regions. Finally, the a single sided polished finish is produced.

Typically, the grinding process involves pressing the wafer against a rotating glass or metal plate and introducing a grinding solution containing relatively large particles therebetween. However, in the grinding processes currently employed, micro cracks are formed into the surface of the silicon. Depending on the process, the micro cracks can extend between 10 and 50 mm into the silicon substrate. This damage degrades the wafer and must be eliminated, whilst retaining flat surfaces on the wafer, by removal of silicon, with a consequent reduction in the thickness of the wafer. This results in the possibility to reprocess the wafer only a few times. This problem has become more apparent as the industry moves to more expensive wafers of larger diameter.

Another disadvantage of apparatus of the type disclosed in U.S. Pat. No. 5,622,875 that finish polish one surface is that the wafer has to be mounted to a fixed plinth, for example using wax. This is time consuming and difficult and there is a risk that the polish plate and plinth may not be parallel.

EP 0 986 097 discloses a similar process in which the film removal step is performed by chemical etching. Next, the surface of the substrate is subjected to a combination of polishing and grinding to remove a layer of about 1 $\mu$m in thickness. The polishing and grinding process involves pressing the wafer against a rotating plastics plate and introducing a polishing and grinding solution containing particles of the same and smaller size as the particles used in grinding solution. The solution also has a chemical action on the substrate. Often coating films applied to front surface of the wafer spread to the rear of the wafer and in order to overcome this problem, the polishing and grinding is carried out by a double-sided polishing machine having contra-rotating plates. Since this process still partly relies on grinding, the above-mentioned problem of cracking is not fully alleviated.

Generally, semiconductor wafers have one polished surface and one unpolished (matt) surface. During the manufacture of semiconductor components on the wafer, the handling and processing apparatus relies on this difference in finish to determine the correct side of the wafer to be processed.

Accordingly, wafers reclaimed by the process of EP 0 986 097 suffer from the problem that they cannot be subsequently processed by handling and processing apparatus which rely on the difference in finish.

Some wafers do require polishing on opposite surfaces and hitherto this has meant that one facility is required to polish single-sided wafers and another is required to polish double-sided wafers. A disadvantage of this is that the apparatus required to polish wafers is expensive.

We have now devised a wafer reclaim process which alleviated the above-mentioned problems.

SUMMARY OF THE INVENTION

The invention provides in one of its various aspects a silicon wafer reclaim process material which comprises the following sequential steps:

(a) procuring a semiconductor silicon wafer having two major surfaces disposed generally parallel to one another and edge surface portions extending between said major surfaces, at least one of the major surfaces having had films of foreign matter removed therefrom by etching;

(b) supplying polishing fluid between the major surfaces of the wafer and contra-rotating polishing means, said polishing means rotating about an axis at least substantially normal to the major surfaces of the wafer so as to simultaneously polish both the major surfaces of the wafer;

(c) rendering matt at least a portion of one only of the polished major surfaces of the wafer;

(d) cleaning the major surfaces of the wafer; and (e) drying the wafer.

The silicon wafer procured for use in step (a) may have been etched to remove films of foreign material by any suitable etching technique for example, bath, plasma or gaseous methods. We prefer to procure one which has been etched by use of a spin etching technique, in which a single wafer is spun on a rotating chuck and etching fluid, for example acid (such as concentrated hydrofluoric acid), is dispensed onto the centre of the spinning wafer. This allows the acid to be evenly distributed over the wafer and, because of the high fluid dynamics, etching fluid is continuously available to diffuse into the wafer evenly, substantially over the entire wafer from the centre outwards. Alternatively, lapping may be used.

As the etching occurs, there is a sharp change in color of the wafer surface when the foreign material has been removed and the silicon is exposed, which change can be detected by an end-point detector, which thereby permits the process to be stopped with minimum wastage of the silicon material. The spin etching process is ideally suited for removal of films of copper and tungsten, which are notoriously difficult to remove conventionally. Another advantage of spin etching is that metal contamination is removed effectively as the chemicals flow off the wafer, removing any metals. After the films of foreign material have been removed, a rapid chemical polishing step is thus possible. Spin etching allows multiple chemicals to be used in one process.

In a process according to the present invention, the required removal of the doped and diffused regions in the wafer substrate is solely achieved by polishing, in order to alleviate the risk of crack formation. The polishing is carried out in a double sided polisher in which the silicon wafer preferably freely "floats" between the contra-rotating (driven) pads, while polishing fluid typically in the form of slurry is applied such that both sides of the wafer are polished at the same time. An advantage of polishing between two contra-rotating plates is that the wafer does not have to mounted to a fixed plinth, for example using wax and a polished wafer is produced having polished surfaces which are perfectly parallel.

Preferably, the polishing step is continued until the wafer surfaces give a roughness measurement of between 40 and 100 Angstroms. The polishing means preferably includes pads of resilient, hard elastomer materials, for example of polyurethane or the like.

Preferably the polishing fluid employed in the process according to the invention comprises an aqueous caustic fluid (typically of pH 11 or above). Double sided polishing of individual wafers enables production of substrates with very flat, parallel major surfaces. If desired, the double sided polisher may have pads on opposite sides of the wafer which are of different materials (such as elastomers of different hardness values) whereby to effect different characteristics on the two major surfaces of the wafer.

In a process according to the present invention, the one of the major surfaces of the wafer is then rendered matt, so that it can be subsequently processed by handling and processing apparatus which relies on the difference in finish. Typically this process of rendering matt would only be carried out on wafers of up to 200 mm in diameter.

Larger wafers are usually polished on both sides, owing to the different type of handling and processing apparatus used. It will be appreciated that such larger wafers can be reclaimed using the same apparatus as used in the process according to the present invention, with the exception that the rendering matt step is omitted. In this manner the expense of two reclaim facilities for single sided and doubled sided polish wafers is avoided.

The rendering matt stage step is preferably conducted by placing the wafer in a Bernoulli chuck in which the wafer floats on a cushion of gas such as nitrogen, with its second major surface facing upwards and then spin etching the surface with etchant directed onto that surface of the wafer whilst it is spinning. The opposite surface if the wafer is kept away from the surface of the chuck by the gas and thus is not damaged. The rendering matt stage has further advantages for normalizing the back surface of the wafer thus enabling more accurate pyrometric measurements during thermal processing.

In a process according to the present invention, after the polishing and rendering matt steps, the surfaces of the wafer are cleaned to remove the polishing fluid. Preferably this step includes ultrasonic treatment (typically using high frequency and possibly also low frequency megasonic transducers) to remove substantially all particles measured down to 0.2 mm, followed by rinsing in ozonated water and an hydrofluoric acid clean coupled with ozone to re-grow the native oxide, according to the IMEC cleaning method (I.E.E.E. Proceedings (1994), Mark Haynes et al). A chelating agent and/or acid such as hydrochloric acid may be introduced to the final rinse to assist metal removal efficiency. Also, in the high frequency step, certain additives such as $H_2O_2$, acetic acid or iso-propanol may be introduced to lower the zeta potential of the acid and thereby inhibit particle addition to the wafer surfaces and to promote particle removal. Furthermore, additives may be introduced to vary the pH of the acid to reduce plating of heavy metals such as copper onto the wafer surface.

After the cleaning step, the wafer surfaces are dried, preferably using Marangoni forces arising from induced surface tension changes. Using the Marangoni dryer on reclaim wafers ensures the wafer surface is substantially clean of contaminants. The IMEC clean does not use ammonia, which would attack silicon at the atomic level. The cleaning step employed enables surface qualities not previously achievable to be obtained. Also, the surface at the end of the cleaning and drying steps is generally hydrophilic in a consistent manner, which is of assistance for those wafers to be used for diffusion monitors.

After the drying steps, the wafers may be measured for dimensional characteristics such as thickness, bow, warp and resistivity. These measurements may be performed on an ADE9300 machine, which is a highly advanced, fast throughput machine, which uses robotic handling to ensure reduced particles and contamination. This machine will sort the wafers into pre-defined specifications and will provide a traceable measurement. The wafers may then be measured for particles and surface characteristics. Usually at this stage, only particles are measured, but when working at 0.15 $\mu$m, then the surface and haze may have to checked as they will show wafer or process problems. At this measurement size, it is difficult to distinguish between pits and particles. Preferably an ADE CRQ machine is used for this determination because it has the capability to measure particles and haze on one pass. The ADE CRQ machine can also distinguish between COPs and particles and can identify nano topology, which allows full characterization of the polishing process from surveying the wafer surface to giving a three dimensional picture of the wafer surface.

By use of a process according to the present invention it is possible to reclaim silicon wafers without subjecting them to abrasive lapping, and they may be reclaimed with minimal loss of silicon whilst maintaining the flatness of the wafers. As the wafers have not been lapped, there is likely to be very little damage to the substrate so the polishing time and the amount of silicon to be removed can be small. Consequently the polishing can be kept to a minimum, maximizing throughput, and the wafer can potentially be reclaimed according to the invention multiple times.

BRIEF DESCRIPTION OF THE DRAWINGS

An embodiment of this invention will now be described with reference to the accompanying drawings, in which.

DETAILED DESCRIPTION OF THE PREFERRED EMBODIMENT

Figure 1:
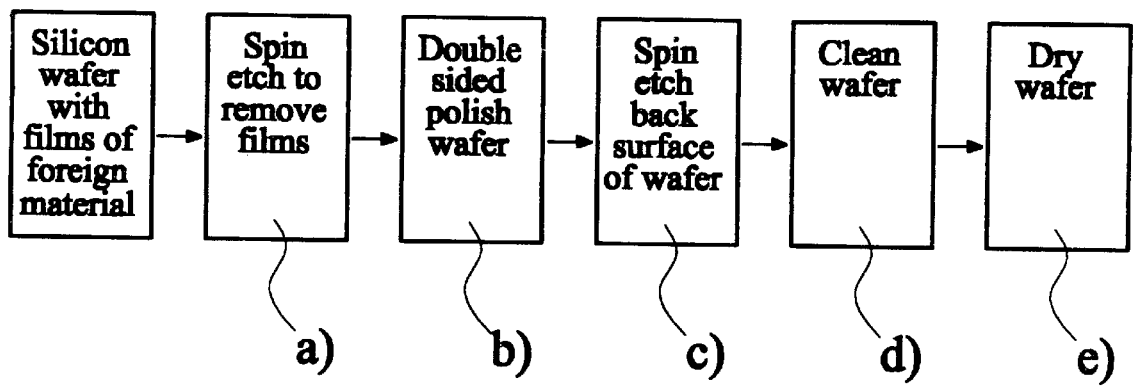
FIG. 1 is a flow diagram showing steps of an embodiment of process according to the invention.
Figure 2:
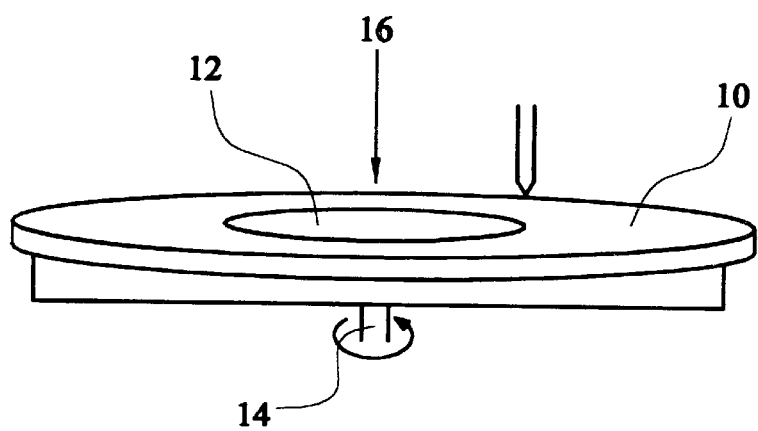
FIG. 2 is a diagram showing a spin etching step in the process of FIG. 1.

In the exemplary process, there is employed as starting material a used semiconductor wafer 10 comprising a silicon substrate having two major surfaces disposed generally parallel to one another and edge surface portions extending between them, at least one 12 of the major surfaces having a film of foreign material adherent to it. In order to remove the film of foreign material, the wafer is mounted on a chuck 14 (FIG. 2) with its surface 12 disposed horizontally and facing upwards. The chuck is rotated and etching fluid 16, for example hydrofluoric acid, is dispensed onto the centre of the spinning wafer and allowed to flow outwardly from the centre of the wafer. As etching takes place, there is a sharp change in color of the wafer surface when the foreign material has been removed and the silicon is exposed, which change is detected by an end-point detector 18 permitting the process to be stopped with minimum wastage of the silicon material.

Figure 3:
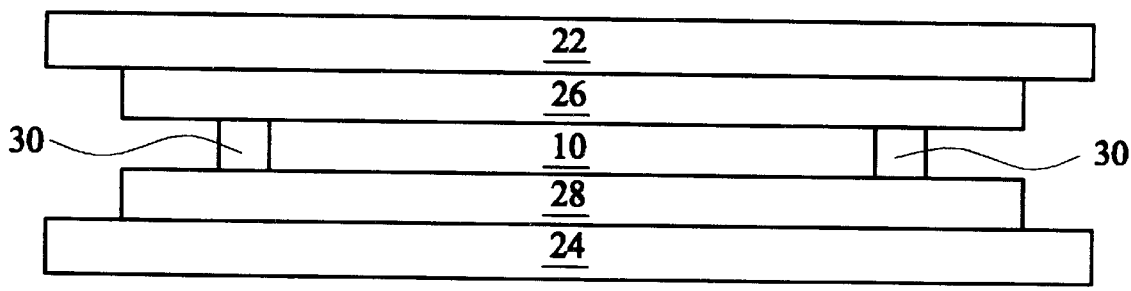
FIG. 3 is a diagram showing a double sided polishing step in the process of FIG. 1.

Having removed the film of foreign material 12, the wafer is removed from the chuck and, thus procured, is located in a double side polishing machine (FIG. 3) having platens 22 and 24 disposed for rotation in opposite directions about a vertical axis. Polishing pads 26 and 28 are arranged for rotation with the platens. The wafer is located between the polishing pads within the confines of a carrier 30. The wafer is thus between the polishing pads arranged for contra-rotation about an axis at least substantially normal to the major surfaces of the wafer so as to simultaneously polish both of the major surfaces of the wafer. The wafer is thus free to "float" between the polishing pads as they are rotated. Polishing slurry is supplied between the major surfaces of the wafer and the polishing pads.

The wafer, being of appropriate thickness after the polishing step, is subjected to the step of rendering matt at least a portion of one only of the major surfaces of the wafer. This can be carried out by placing the wafer in a Bernoulli chuck, with its second major surface facing upwards, and then spin etching the surface with an etchant containing at least hydrofluoric, sulphuric or nitric acid.

After polishing and etching the back surface of the wafer, the surfaces of the wafer may be cleaned to remove the slurry by treatment in a megasonic cleaner (having high frequency megasonic transducers) to remove substantially all particles measured down to at least 0.2 mm, followed by rinsing in ozonated water and hydrofluoric acid coupled, with ozone to re-grow the native oxide, according to the IMEC cleaning method.

After cleaning, the wafer surfaces can be dried using Marangoni forces arising from induced surface tension changes.

What is claimed is:

1. A silicon wafer reclaiming process, which comprises the following sequential steps:

a) procuring a semiconductor silicon wafer having two major surfaces disposed generally parallel to one another and edge surface portions extending between said major surfaces, at lest one of the major surfaces having had films of foreign matter removed therefrom by etching;

b) supplying polishing fluid between the major surfaces of the wafer and contra-rotating polishing means, said polishing means rotating about an axis at least substantially normal to the major surfaces of the wafer so as to simultaneously polish both the major surfaces of the wafer;

c) rendering matt at least a portion of one only of the major surfaces of the wafer;

d) cleaning the surfaces of the wafer; and e) drying the cleaned wafer.

2. A process according to claim 1, wherein the polishing fluid comprises a slurry of fine silicon particles in an aqueous vehicle.

3. A process according to claim 1, wherein the surface is rendered matt in step c) by placing the wafer in a Bernoulli chuck and spin etching the surface with an acid.

4. A process according to claim 1, wherein the wafer is cleaned in step d) by an IMEC technique.

5. A process according to claim 1, wherein the cleaned wafer is dried in step e) by a Marangoni drying technique.

6. A process according to claim 1, wherein the films of foreign matter on the wafer have been removed by spin etching.

* * * * *